United States Patent
Kung et al.

(10) Patent No.: US 6,631,755 B1
(45) Date of Patent: Oct. 14, 2003

(54) THERMAL MODULE WITH TEMPORARY HEAT STORAGE

(75) Inventors: Shao-Tsu Kung, Taipei (TW); Chen-Hua Liu, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 10/064,464

(22) Filed: Jul. 17, 2002

(51) Int. Cl.[7] ................................................. F28F 7/00
(52) U.S. Cl. ............... 165/46; 165/104.33; 165/104.14; 165/902; 361/687; 361/700; 257/715
(58) Field of Search ...................... 165/10, 104.21, 165/104.26, 104.33, 46, 902, 104.14, 96; 361/697, 700, 687; 257/715, 714

(56) References Cited

U.S. PATENT DOCUMENTS

| | | | | |
|---|---|---|---|---|
| 2,499,736 A | * | 3/1950 | Kleen | 165/104.21 |
| 3,596,713 A | * | 8/1971 | Katz | 165/902 |
| 4,285,027 A | * | 8/1981 | Mori et al. | 165/104.21 |
| 4,415,118 A | * | 11/1983 | Endo | 165/10 |
| 4,976,308 A | * | 12/1990 | Faghri | 165/10 |
| 5,579,830 A | * | 12/1996 | Giammaruti | 165/104.33 |
| 6,191,944 B1 | * | 2/2001 | Hammel et al. | 165/104.33 |
| 6,260,613 B1 | * | 7/2001 | Pollard, II | 165/104.33 |

* cited by examiner

*Primary Examiner*—Christopher Atkinson
(74) *Attorney, Agent, or Firm*—Winston Hsu

(57) ABSTRACT

A thermal module with temporary heat storage. The thermal module includes a heat storage, a heat absorber, a heat dissipater, and a heat pipe for rapidly transferring heat from the heat absorber to the heat dissipater. The heat storage includes a phase change material and is in contact with the heat pipe. When heat quantities generated by the system are greater than a predefined reasonable thermal target, heat in excess of the thermal target is temporarily absorbed into the heat storage through the melting of the PCM. When the heat quantities generated by the system are again less than the thermal target, the PCM re-freezes, releasing the stored heat to be dissipated normally.

15 Claims, 4 Drawing Sheets

THERMAL MODULE WITH TEMPORARY HEAT STORAGE

BACKGROUND OF INVENTION

1. Field of the Invention

The present invention relates to a thermal module,.more specifically, a thermal module that uses a phase change material to temporarily store excess heat.

2. Description of the Prior Art

Quantities of heat generated by modern electrical components are often large enough to severely damage or destroy the components that generate the heat if proper precautions are not taken. These precautionary measures range from passive heat sinks to liquid refrigeration systems, but all have one common purpose, to transfer heat away from the generating device.

A well-known approach is to enlist the aid of a heat pipe. The conventional heat pipe is a hollow, partially evacuated tube. Inside the tube is a wick-like structure composed of a copper mesh or a similarly functioning component saturated with a predetermined fluid. When an end of the heat pipe is exposed to a heat source, the contained fluid at that end of the heat pipe boils, rapidly transferring heat to a cooler end of the heat pipe where the gas condenses. The condensed gas is sucked back to the region of highest heat through a capillary action of the wicks. This process effectively transfers heat many times quicker and farther than could be done by using a solid bar of a high heat conducting substance such as copper.

Many variations of heat pipes, including looped heat pipes, are used in varying situations with varying degrees of success. One of the most common uses of a heat pipe is to rapidly transfer heat from an electrical component to a heat dissipater, often a fanned or passive heat dissipater similar to a finned heat sink. Efficiency of such a system dictates that the heat dissipater must be able to dispose of unwanted heat about as rapidly as it is absorbed by the heat pipe, otherwise the related temperatures will continue to climb. In a prior art thermal module, this ability to dissipate heat as quickly as heat is absorbed is critical. If the temperature inside the condensing portion of the heat pipe exceeds the boiling point of the internal fluid, even temporarily, the heat pipe fails to function as intended and damage to related electrical components is a likely result.

Please refer to FIG. 1 of a graph of the levels of heat generated by the electrical components in a PC during a hypothetical period of use. Two horizontal divisions are shown. Amounts of heat below the passive cooling limit will not vaporize the fluid in the heat pipe and are dissipated passively. During time periods when the quantity of heat generated exceeds the passive cooling level, the fluid in the heat pipe boils and the heat pipe begins to actively transfer heat away from the electrical components and to the heat dissipater. It is obvious that usages such as those requiring frequent hard drive activity or CD access generate-more heat than typing in a word processing program. Therefore, the graph shows a typical series of peaks and valleys representing periods of higher and lower demands being placed on the system, and therefore higher and lower quantities of heat being generated.

However, because the efficiency of the system dictates that the heat dissipater must be able to dispose of unwanted heat about as rapidly as it is absorbed by the heat pipe, the entire thermal module must be designed around a thermal ceiling, the maximum quantity of heat that can be produced without damaging the electrical components. This thermal ceiling characteristic of the prior art thermal module makes it difficult to reduce the size of a thermal module, including the heat dissipater, a relatively large component occupying much needed space in many smaller applications. In fact, because faster CPUs generally generate larger amounts of heat, manufacturers face a serious conflict between the demand for a smaller product and the need to provide a large enough heat dissipater to accommodate the thermal ceilings in today's PCs.

SUMMARY OF INVENTION

It is therefore a primary objective of the claimed invention to disclose a thermal module whose design is not dictated by a thermal ceiling, allowing the use of a smaller heat dissipater, while providing adequate thermal protection to the related electrical components.

The claimed invention includes a heat pipe for rapidly transferring heat from a heat absorber to a heat dissipater, and a heat storage also in flush contact with the heat pipe. The heat storage includes a phase change material (PCM) that changes from a solid state to a liquid state at a predetermined and specific temperature approximately corresponding to a reasonable thermal target. A flexible, thermally and electrically insulated casing inclosing the PCM allows it to be placed in small areas between the electrical components, occupying no more than what is normally wasted space.

It is an advantage of the claimed invention that the use of the phase change material, to temporarily store excess heat in a system, allows a smaller thermal module designed around a reasonable thermal target to provide adequate thermal protection.

These and other objectives of the present invention will no doubt become obvious to those of ordinary skill in the art after -reading the following detailed description of the preferred embodiment, which is illustrated in the various figures and drawings.

DETAILED DESCRIPTION

The present invention thermal module includes a heat absorber, a heat dissipater, a heat pipe, and a phase change material to temporarily store heat generated by a system in excess of a reasonable thermal target.

Figure 1:
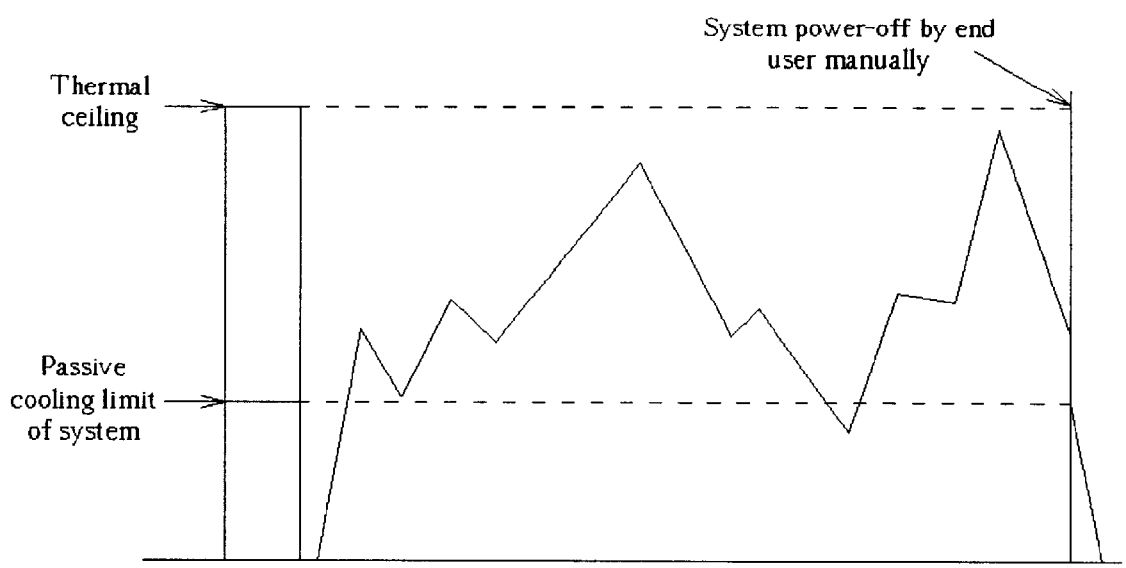
FIG. 1 is a graph of heat levels generated by a PC according to a prior art.
Figure 2:
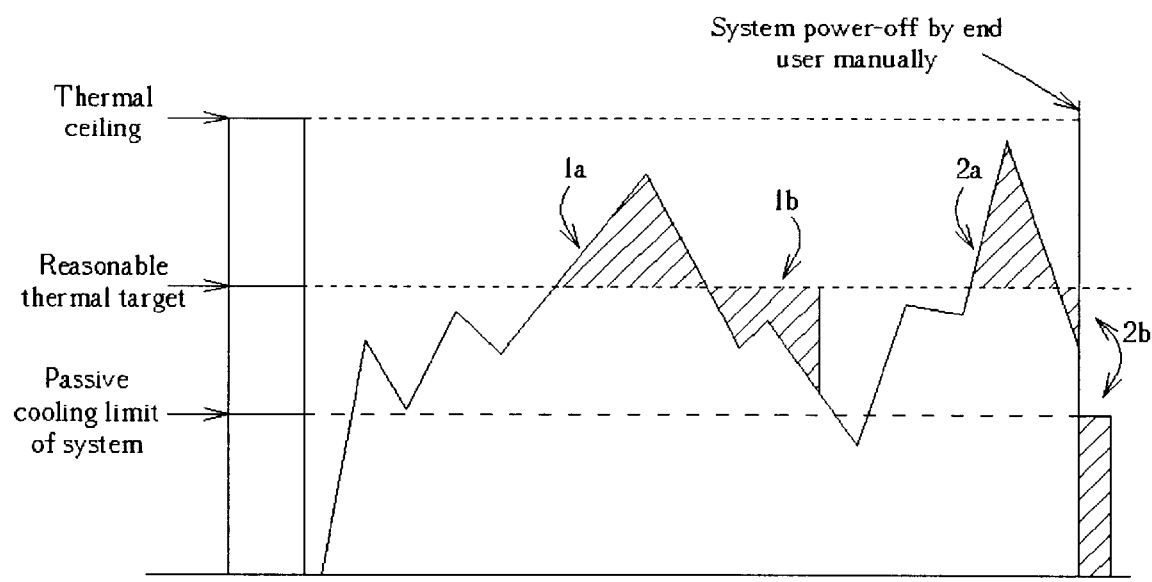
FIG. 2 is a graph of heat levels generated by a PC according to the present invention.

The chart of FIG. 2 depicts the levels of heat generated by electrical components in a typical laptop PC in a typical period of use. There are three horizontally divided areas, a passive cooling limit, a reasonable thermal target, and a thermal ceiling. The passive cooling limit represents the maximum quantity of heat that can be passively dissipated by the system through natural conduction, convection, or radiation. The thermal ceiling represents the maximum amount of heat that can be produced and tolerated by the system without damaging the electrical components. Above the passive cooling limit and below the thermal ceiling is the reasonable thermal target.

All computer systems undergo fluctuations in the intensity of demands placed on the system and therefore the quantity of heat produced. The most obvious example of a high demand use of the system is a program that requires intensive CPU utilization and frequent high-speed disk or CD access, such as merely playing a video. System demands during a word processing session, or more dramatically a standby state, are obviously lighter and result in a smaller quantity of heat being produced than when in a high demand situation. Therefore, the quantity of heat generated by the system during a typical period of use fluctuates as illustrated in FIG. 2.

It is obvious from the chart that designing a thermal module around the thermal ceiling results in excess thermal protection in all but extreme situations. Therefore the present invention replaces the concept of this seldom used thermal ceiling with a more practical, reasonable thermal target better representing the amount of heat generated by the system under normal operating conditions. Quantities of heat below the reasonable thermal target are absorbed and transferred via the heat pipe to the heat dissipater normally. When the system temporarily generates heat in excess of the thermal target, the excess heat 1a, 2a is temporarily stored in the heat storage. During this time, amounts of heat up to the thermal target continue to be dissipated normally via the thermal dissipater while only the heat 1a, 2a in excess of the thermal target is stored. When the system's generation of heat returns to a less extreme level and again falls below the thermal target, the stored heat 1a, 2a is released back into the system to be dissipated normally.

Items 1b and 2b of FIG. 2 represent the stored heat 1a, 2a after it has been released back into the system. The areas of the regions 1a and 1b are equal as are the areas of 2a and 2b. In other words, the amount of heat absorbed by the PCM is equal to the amount of heat released by the PCM. Because the thermal module is designed to adequately actively dissipate levels of generated heat up to the reasonable thermal target, when the generation of heat falls below the thermal target, the thermal module is clearly able to additionally dissipate any heat that may be in storage.

In the preferred embodiment of the present invention, the heat storage comprises a phase change material to temporarily absorb the excess heat. A PCM such as wax-60 changes from a solid state to a liquid state between 53–60 degrees Celsius. The wax-60 has a latent heat of 264 J/g and the density of wax-60 is 1105 $cm^3$/kg. This translates into 100 grams of wax-60 being able to absorb 264,000 Joules (7.3 Watt-Hours) of heat while changing from a solid to a liquid. Another way to say it is that 100 grams of wax-60 can absorb 7.3 Watts of excess heat for an hour with minimal change in volume.

The use of wax-60 is only to be considered an example PCM in the present invention. The PCM could be another substance, such as paraffin wax, $H_2O$, $NA_2S_2$+5 $H_2O$, Neopentyl glycol, etc. The change from a solid state to a liquid state is also only an example phase change. However, the change from a solid state to a liquid state has the distinct advantage of absorbing a relatively large amount of heat with a minimal change in volume.

The PCM can be enclosed in a flexible casing made of some electrically and thermally insulated material and can be of any shape or size. When combined with the constant volume characteristic stated above, the electrically and thermally insulated casing allows the PCM to be placed in unused gaps between existing system components without requiring additional space or system redesign.

Figure 3:
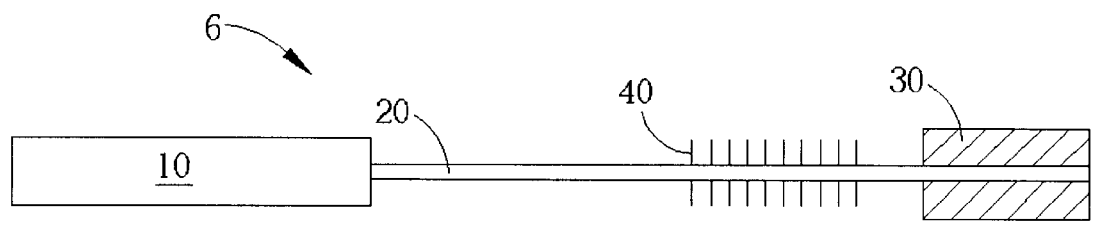
FIG. 3 is a structural diagram of a thermal module according to the present invention.
Figure 4:
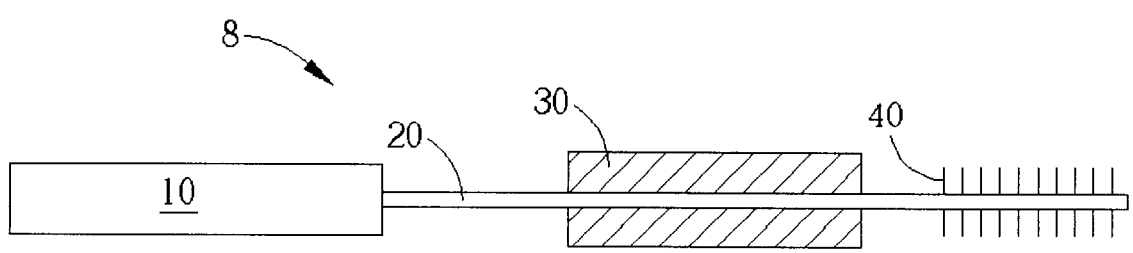
FIG. 4 is a structural diagram of another thermal module according to the present invention.

The operation of the present invention can best be seen in FIG. 3 and FIG. 4. FIG. 3 is a structural diagram of a thermal module 6 according to the present invention. FIG. 4 is a structural diagram of another thermal module 8 according to the present invention. The thermal module 6, 8 comprises a heat absorber 10, a heat pipe 20, a heat storage 30, and a heat dissipater 40. The heat pipe 20 is conventional in nature and is used to rapidly transfer heat from the heat absorber 10 to the heat dissipater 40. The heat dissipater 40 of the thermal module 6 is fixed to the heat pipe 20 between the heat absorber 10 and the heat storage 30 as shown in FIG. 3. However, the heat storage 30 of the thermal module 8 is fixed to the heat pipe 20 between the heat absorber 10 and the heat dissipater 40 as shown in FIG. 4. The operating principles of the heat pipe 20, the heat absorber 10, and the heat dissipater 40 are well know in the art and will not be further elaborated on here.

The heat storage 30 includes a PCM at least partially enclosed in an electrically and thermally insulated, flexible casing. An area of the PCM is in flush contact with the heat pipe 20 allowing high heat conductivity and low thermal resistance between the heat pipe 20 and the PCM.

When the laptop is initially turned on, the level of generated heat is below the passive cooling limit. Soon the system begins to generate heat in excess of the passive cooling limit and less than the thermal target. At this point, the fluid in the heat absorber 10 end of the heat pipe 20 begins to vaporize, quickly transporting heat from the heat absorber 10 to the heat dissipater 40. Because the PCM in the heat storage 30 does not change from a solid to a liquid until the thermal target has been reached, relatively little energy is absorbed by the PCM and the vast majority is removed from the system by the heat dissipater 40.

Occasionally, during a period of intense demand on system resources, the heat generated within the system increases to a value exceeding the thermal target. The PCM in the heat storage 30 begins to change from a solid state into a liquid state, absorbing heat in excess of the thermal target in the process. The heat pipe 20 continues to transfer heat to both the heat dissipater 40 and the PCM. The heat dissipater 40 continues to dispose of amounts of heat up to the thermal target while amounts of heat in excess of the thermal target are temporarily absorbed through the melting process of the PCM.

When the intensity of demands on system resources returns to normal and therefore the production of heat within the system again falls below the thermal target, the heat pipe 20 continues to carry heat from the heat absorber 10 to the heat dissipater 40. However, because the level of heat is below the thermal target and the freezing point of the PCM, the PCM begins to re-solidify, releasing stored heat in the process. Because the heat dissipater 40 is able to dispose of more heat than is currently being generated by the system, the heat dissipater 40 can also dispose of the released stored heat adequately.

The cycle of storing excess heat during periods of high heat generation and releasing the stored heat during periods of lower heat generation can be repeated as often as required and indefinitely. The use of the PCM to temporarily store heat produced in excess of the reasonable thermal target and releasing the stored heat when the system generates a lower level of heat is clearly more efficient than the prior art. This feature of the present invention offers a distinct advantage over the prior art in allowing a reduction in the size of the thermal module while maintaining adequate thermal protection.

Those skilled in the art will readily observe that numerous modifications and alterations of the device may be made while retaining the teachings of the invention. Although this disclosure discusses a thermal module in a laptop computer, the application of the present invention is not limited to a laptop PC. For example, all types of computers have heat dissipation concerns addressed by the present invention, as do many other kinds of devices. Additionally, the use of a plurality of types of PCMs for heat storage that change from one physical state to another physical state at differing temperatures should also be considered within the scope of the present invention. Accordingly, the above disclosure should be construed as limited only by the metes and bounds of the appended claims.

What is claimed is:

1. A thermal module for dissipating heat in a laptop computer, the thermal module comprising:
    a heat pipe for rapidly transferring heat;
    a heat absorber disposed at one end of the heat pipe for absorbing heat from a heat generating electrical component;
    a heat dissipater disposed at another end of the heat pipe for dissipating the heat; and
    a heat storage disposed at a section of the heat pipe between the heat absorber and the heat dissipater, the heat storage comprising a thermally and electrically insulated casing;
    wherein the electrically and thermally insulated casing allows the heat storage to be placed in unused gaps between existing system components without requiring additional space or system redesign.

2. The thermal module of claim 1 wherein the heat storage is fixed flush against all surfaces contacting the heat pipe and not in physical contact with the heat absorber and not in physical contact with the heat dissipater.

3. The thermal module of claim 1 wherein the heat storage is not in physical contact with the heat dissipater.

4. The thermal module of claim 1 wherein the casing is flexible.

5. The thermal module of claim 1 wherein the heat storage is not in physical contact with the heat absorber.

6. The thermal module of claim 1 wherein the casing at least partially encloses a first phase change material, an area of the first phase change material being in flush contact with the heat pipe.

7. The thermal module of claim 6 wherein the first phase change material is selected from the group consisting of wax, water, neopentyl glycol (NPG), and $Na_2S_2O_3+5H_2O$.

8. The thermal module of claim 6 wherein the first phase change material changes from a solid state to a liquid state at a first predetermined temperature.

9. The thermal module of claim 8 further comprising a second phase change material disposed within the heat pipe.

10. The thermal module of claim 9 wherein the second phase change material changes from a liquid state to a gaseous state at a second predetermined temperature.

11. The thermal module of claim 10 wherein the first predetermined temperature is higher than the second predetermined temperature.

12. A thermal module for dissipating heat in a laptop computer, the thermal module comprising:
    a heat generating electrical component;
    a heat sink capable of continuously dissipating a maximum of a predefined reasonable thermal target quantity of heat at a predefined temperature, the reasonable thermal target being less then a maximum quantity of heat generated by the electrical component under operating conditions;
    a heat pipe for transferring heat from the electrical component to the heat sink, one end of the heat pipe being in thermal contact with the heat generating electrical component, another end of the heat pipe being in thermal contact with the heat sink;
    a heat storage device fixed to the heat pipe between the heat generating electrical component and the heat sink; and
    a phase change material disposed within the heat storage device, an area of the phase change material being in flush contact with the heat pipe, the phase change material changing from solid state to a liquid state at approximately the predefined temperature.

13. The thermal module of claim 12 wherein the heat storage device comprises an electrically and thermally insulated casing.

14. A method for reducing the size of a heat sink in a laptop computer, the method comprising:
    generating heat with an electrical component;
    utilizing a heat pipe to transfer the heat from the heat generating electrical component to the heat sink;
    utilizing at least on gap between components of the laptop computer to hold a predetermined quantity of phase change material, the phase change material being at least partially enclosed by a thermally and electrically insulated casing, an area of the phase change material being in flush contact with the heat pipe between the heat sink and the heat generating electrical component;
    storing a portion of the heat in the phase change material during periods of high heat generation; and
    releasing the stored heat during periods of low heat generation.

15. The method of claim 14 wherein the components forming the gap between components of the laptop computer utilized to hold the predetermined quantity of phase change material are electrical components.

* * * * *